United States Patent
Sing et al.

(10) Patent No.: US 6,645,818 B1
(45) Date of Patent: Nov. 11, 2003

(54) METHOD TO FABRICATE DUAL-METAL GATE FOR N- AND P-FETS

(75) Inventors: Ho-Chaw Sing, Singapore (SG); Ng Chit Hwei, Singpore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 10/293,577

(22) Filed: Nov. 13, 2002

(51) Int. Cl.⁷ .......................................... H01L 21/8234
(52) U.S. Cl. ........................ 438/275; 438/199; 438/592; 438/652
(58) Field of Search ................................ 438/199, 275, 438/283, 592, 653, 656, 666, 652, FOR 187, FOR 217; 257/E27.064, E21.637

(56) References Cited

U.S. PATENT DOCUMENTS

| | | | |
|---|---|---|---|
| 5,447,874 A | 9/1995 | Grivna et al. | 437/40 |
| 5,731,239 A | 3/1998 | Wong et al. | 438/296 |
| 5,786,256 A | 7/1998 | Gardner et al. | 438/305 |
| 6,001,698 A | 12/1999 | Kuroda | 438/303 |
| 6,033,963 A | 3/2000 | Huang et al. | 438/303 |
| 6,066,533 A | 5/2000 | Yu | 438/275 |
| 6,114,206 A | 9/2000 | Yu | 438/270 |
| 6,184,083 B1 | 2/2001 | Tsunashima et al. | 438/257 |
| 6,303,418 B1 * | 10/2001 | Cha et al. | 438/199 |
| 6,514,827 B2 * | 2/2003 | Kim et al. | 438/292 |

FOREIGN PATENT DOCUMENTS

EP   1032033 A2  *  8/2000  .......  H01L/21/8234

OTHER PUBLICATIONS

US 6,410,376 to Ng et al., CS–00–043, "Method to Fabricate Dual—Metal CMOS Transistors for Sub–0.1nm ULSI Integration", Ser. #09/797,555.

* cited by examiner

Primary Examiner—Amir Zarabian
Assistant Examiner—Jamie L. Brophy
(74) Attorney, Agent, or Firm—George O Saile; Rosemary L. S. Pike

(57) ABSTRACT

A new method for forming a dual-metal gate CMOS transistors is described. An NMOS and a PMOS active area of a semiconductor substrate are separated by isolation regions. A nitride layer is deposited overlying a gate dielectric layer and patterned to form a first dummy gate in each of the active areas. First ions are implanted to form source/drain regions in each of the active areas not covered by the first dummy gates. The first dummy gates are isotropically etched to form second dummy gates thinner than the first dummy gates. Second ions are implanted to form lightly doped source/drain regions in each of the active areas not covered by the second dummy gates. Dielectric spacers are formed on sidewalls of the second dummy gates and the source/drain regions are silicided. The second dummy gates and spacers are removed. A first metal layer is deposited overlying the substrate and patterned to form a first metal gate in one of the NMOS and PMOS active areas. An oxide layer is deposited overlying the substrate and the first metal gate. The oxide layer is polished back to the metal gate. A via is opened through the oxide layer to the substrate in the other one of said NMOS and PMOS areas. A second metal layer is deposited within the via opening and polished back to the oxide layer to form a second metal gate in the other one of the NMOS and PMOS area to complete formation of dual-metal CMOS gates.

32 Claims, 6 Drawing Sheets

METHOD TO FABRICATE DUAL-METAL GATE FOR N- AND P-FETS

BACKGROUND OF THE INVENTION (1) Field of the Invention

The present invention relates to the fabrication of integrated circuit devices, and more particularly, to a method of fabricating dual-metal transistors in the fabrication of integrated circuits.

(2) Description of the Prior Art

For sub-0.1 μm CMOS technology, there are a number of issues. The choice of gate dielectric is one issue that will not be addressed here. Other issues related to the gate stack include:

1) Metal gates are needed to replace conventional polysilicon gates in order to reduce poly depletion effects. Depletion effects translate to a reduction in the electric field across the gate dielectric (Eox) and hence inversion charge density; that is, lower drive current. The effect will become more pronounced with smaller gate geometries due to thinner gate oxide, which translates to a higher gate oxide capacitance. This results in a non-negligible depletion capacitance in the polysilicon gate as well as the silicon channel.

2) Metal gates are needed to replace conventional salicided polysilicon gates. Low gate resistance is difficult to achieve with conventional salicide technology due to the conflicting demands of good junction integrity and low gate resistance. On the source/drain, a silicide thickness of less than 20 nanometers is required when gate geometries reach below 70 nm for low specific contact resistivity. On the other hand, it is expected that the silicide thickness on the gate must be at least 45 nm in order to attain a sheet resistance of less than 5 ohms/sq for low signal propagation delay.

3) Different metals are needed for n+ and p+ gates due to gate work function considerations in order to achieve symmetrically low threshold voltages (for low-power devices such as portables) for the NFETs and PFETs.

It is desired to provide a process to address these various concerns.

U.S. Pat. No. 6,001,698 to Kuroda discloses a process for forming CMOS gates using an inverse gate process. U.S. Pat. No. 5,786,256 to Gardner et al shows an inverse polysilicon gate process. U.S. Pat. Nos. 6,114,206 to Yu and 6,184,083 to Tsunashima et al disclose dummy gate polysilicon gate processes. U.S. Pat. No. 6,066,533 to Yu shows a dual metal gate process. U.S. Pat. No. 6,033,963 to Huang et al discloses a metal gate process using a dummy gate. U.S. Pat. No. 5,731,239 to Wong et al teaches a polysilicon gate process. U.S. Pat. No. 5,447,874 to Grivna et al discloses a two layer metal gate. Co-pending U.S. patent application Ser. No. 09/797,555 to N. C. Hwei et al discloses another method of forming dual metal gates that address the issues described herein above.

SUMMARY OF THE INVENTION

Accordingly, a primary object of the invention is to provide a process for forming metal gates for CMOS transistors in the fabrication of integrated circuits.

A further object of the invention is to provide a process for forming dual-metal gate CMOS transistors in the fabrication of integrated circuits.

In accordance with the objects of the invention, a method for forming a dual-metal gate CMOS transistors is achieved. An NMOS active area and a PMOS active area are provided on a semiconductor substrate separated by isolation regions. A pad oxide layer is formed overlying the semiconductor substrate in each of the active areas. A nitride layer is deposited overlying the pad oxide layer. The nitride layer is patterned to form a first dummy gate in each of the active areas. Ions are implanted to form source/drain regions in each of the active areas not covered by the first dummy gates. The first dummy gates are isotropically etched to form second dummy gates thinner than the first dummy gates. Ions are implanted to form lightly doped source/drain regions in each of the active areas not covered by second dummy gates. Dielectric spacers are formed on sidewalls of the second dummy gates. Thereafter, the source/drain regions are silicided. The second dummy gates and spacers are removed. A first gate dielectric layer is deposited overlying the substrate and silicided source/drain regions. A first diffusion barrier layer is deposited overlying the first gate dielectric layer. A first metal layer is deposited overlying the first diffusion barrier layer. The first metal layer, first diffusion barrier layer, and the first gate dielectric layer are patterned to form a first metal gate in one of the NMOS and PMOS active areas. An oxide layer is deposited overlying the substrate and the first metal gate. The oxide layer is polished back to the metal gate. A via is opened through the oxide layer to the substrate in the other one of the NMOS and PMOS areas. A second gate dielectric layer is deposited within the via opening. A second diffusion barrier layer is deposited overlying the second gate dielectric layer. A second metal layer is deposited overlying the second diffusion barrier layer and polished back to the oxide layer to form a second metal gate in the other one of the NMOS and PMOS areas to complete formation of dual-metal gate CMOS transistors in the fabrication of an integrated circuit.

BRIEF DESCRIPTION OF THE DRAWINGS

In the accompanying drawings forming a material part of this description, there is shown.

DESCRIPTION OF THE PREFERRED EMBODIMENTS

The present invention is a simple manufacturable dual-metal gate process. The process scheme allows great flexibility in the choice of gate materials using metals. In addition, a simple isotropic etch is used to achieve reversed LDD and source/drain implantation steps. This is important for shallow extension regions. It is important to note that different metal etching rates due to two different metals for NFETs and PFETs is not an issue in this invention.

Figure 1:
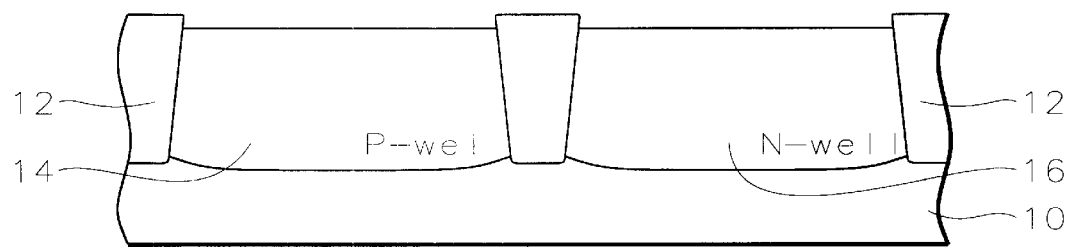
FIGS. 1 through 15 are cross-sectional representations of a preferred embodiment of the present invention.

Referring now more particularly to FIG. 1, there is shown a semiconductor substrate 10. This is preferably monocrystalline silicon. Isolation regions, such as shallow trench isolation (STI) 12, are formed in the substrate to separate active regions. P-well 14 and N-well 16 are formed within the substrate, as is conventional. For example, P-well 14 has been formed in an NMOS active area and N-well 16 has been formed in a PMOS active area. Punchthrough and threshold voltage adjustment implantations, not shown, are made as is conventional in the art.

Figure 2:
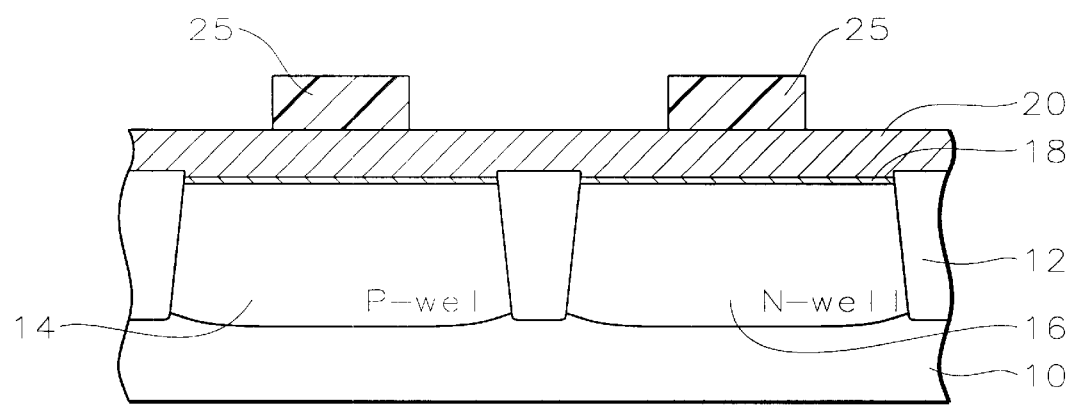

Referring now to FIG. 2, a pad oxide layer 18 is grown or deposited over the substrate to a thickness of between about 100 and 150 Angstroms. A nitride layer 20, such as silicon nitride or $SiO_xN_y$, is deposited over the pad oxide layer 18 to a thickness of between about 2400 and 2600 Angstroms.

Figure 3:
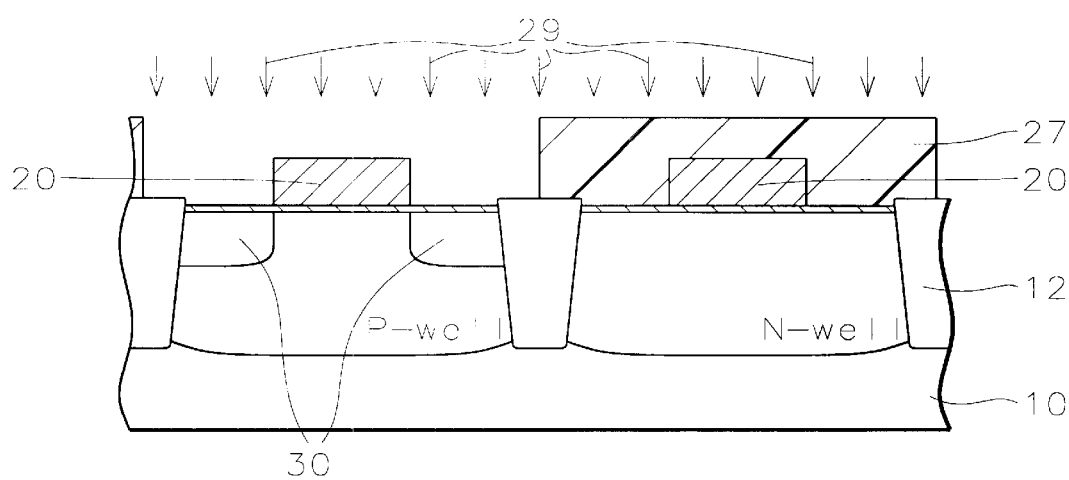

A photoresist mask 25 is formed over the silicon nitride layer 20. The layer 20 is patterned to form dummy gates, as shown in FIG. 3. These dummy gates are larger than the final gates will be, by about 1600 to 1800 Angstroms.

The resist mask 25 is removed. A second mask 27 is formed to shield the PMOS in the N-well area. Ions are implanted 29 into the NMOS active area where they are not blocked by the dummy nitride gate 20 to form source/drain regions 30. The mask 27 is removed.

Figure 4:
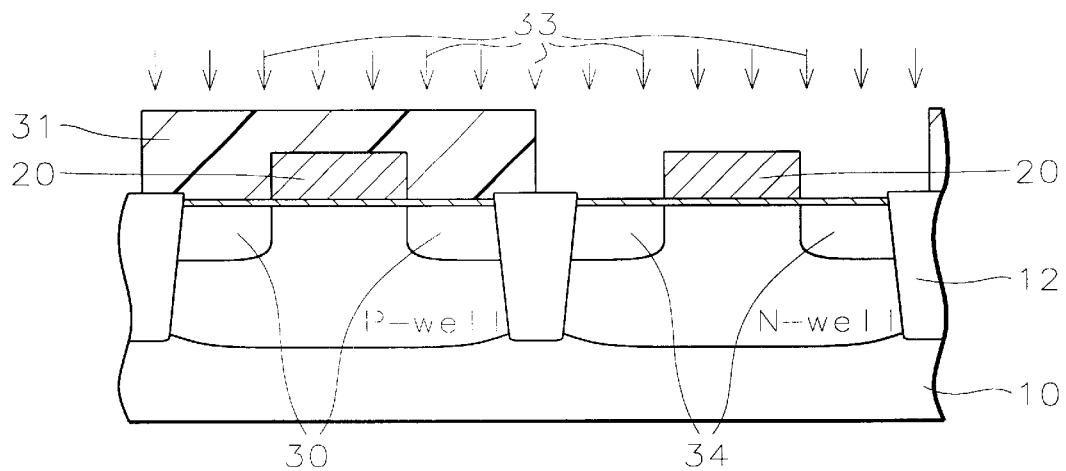

A third mask 31 is formed to shield the NMOS area, as shown in FIG. 4. Ions are implanted 33 into the PMOS active area where they are not blocked by the dummy nitride gate 20 to form source/drain regions 34.

Figure 5:
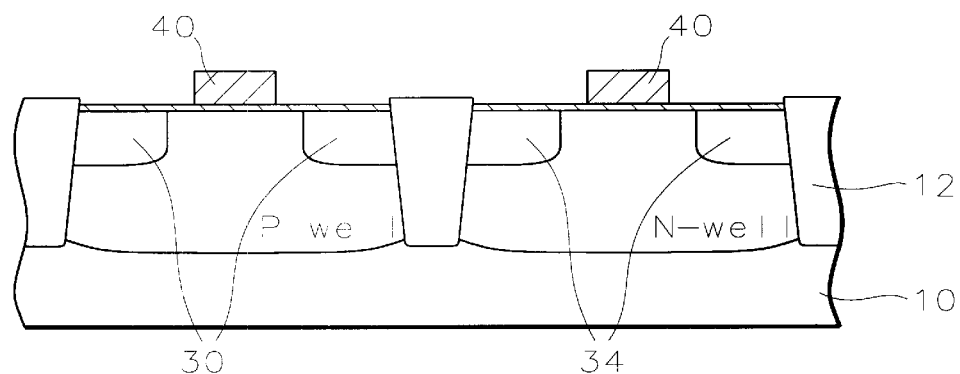

Referring now to FIG. 5, a rapid thermal annealing (RTA) is performed to activate the dopants. The resist mask 31 is stripped. Now, an isotropic chemical wet etch is performed to decrease the width and height of the dummy gates 20. The new dummy gates 40 are smaller in width than the old gates 20 by 1600 to 1800 Angstroms and are shorter than the old gates by 1600 to 1800 Angstroms (or a by about 17%).

Figure 6:
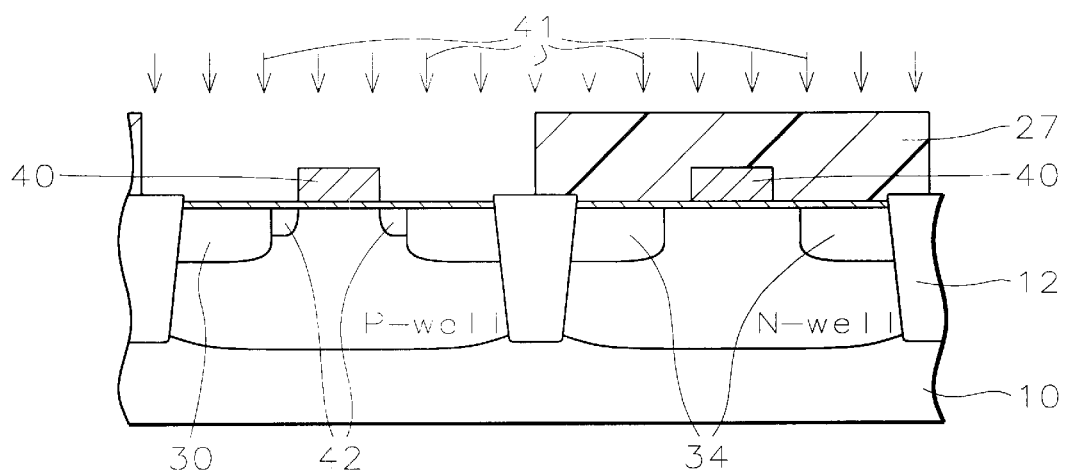

Referring now to FIG. 6, the second mask 27 is again formed to shield the PMOS area. Ions are implanted 41 into the NMOS active area where they are not blocked by the dummy nitride gate 40 to form lightly doped source/drain regions 42. The mask 27 is removed.

Figure 7:
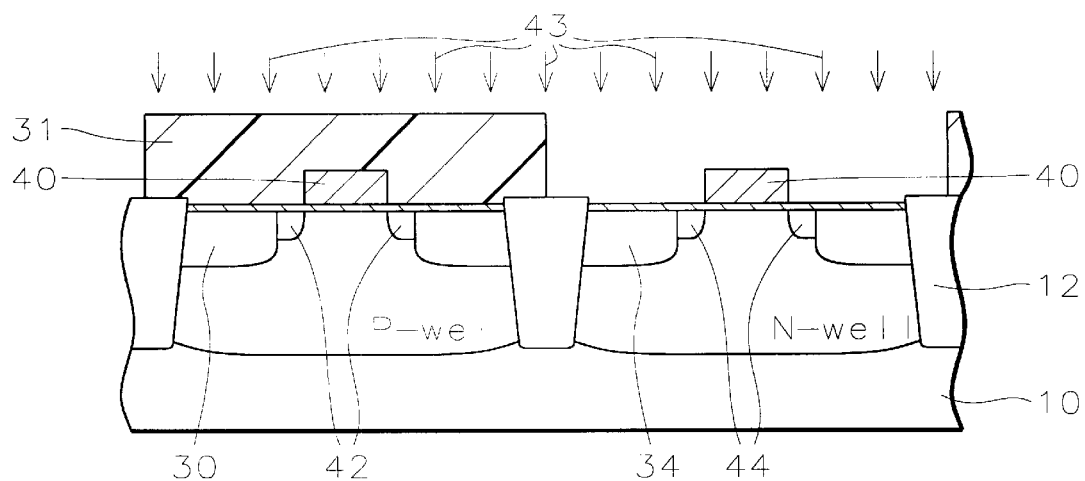

The third mask 31 is again formed to shield the NMOS area, as shown in FIG. 7. Ions are implanted 43 into the PMOS active area where they are not blocked by the dummy nitride gate 40 to form lightly doped source/drain regions 44. The mask 31 is removed.

Figure 8:
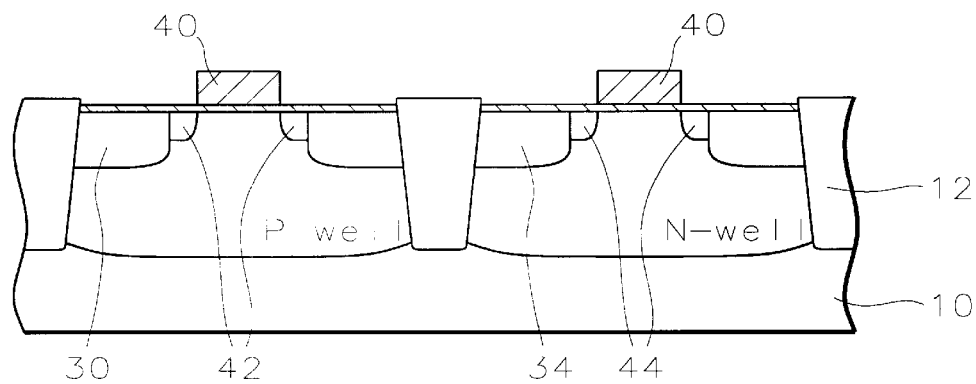

Referring now to FIG. 8, an Excimer pulsed-laser annealing is performed to activate the extension dopants to form shallow junctions and to reduce lateral diffusion.

This completes formation of the LDD and source/drain. Reversing the LDD and source/drain implantation steps is achieved by the isotropic etching technique applied to the dummy gates. This is important to the formation of a well-controlled shallow junction. The shallow junction is achieved by laser annealing of the LDD dopants after the source/drain RTA anneal, as described above in reference to FIG. 5. Alternatively, a single RTA anneal may be performed after the LDD implantation to activate dopants in both LDD and source/drain simultaneously.

Figure 9:
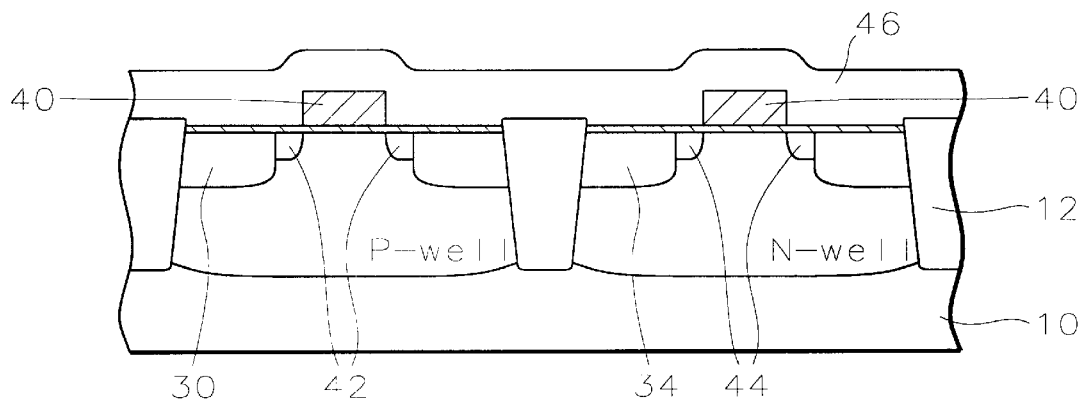
Figure 10:
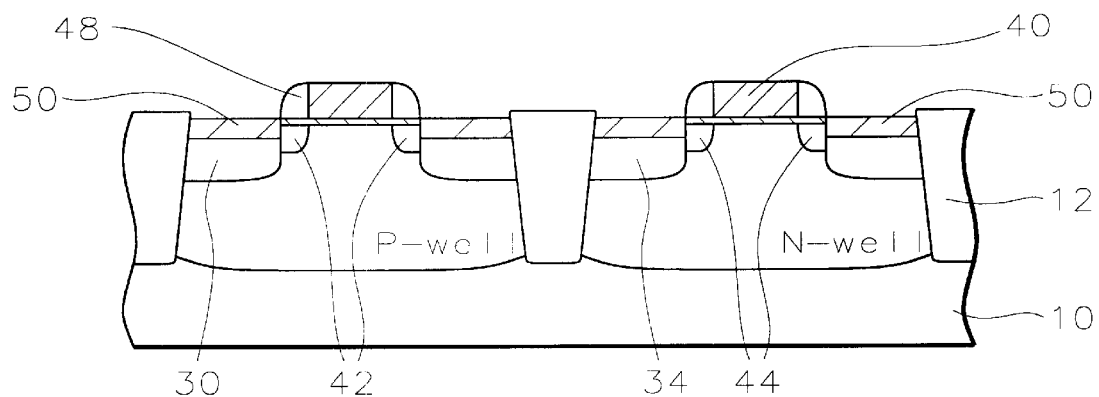

Referring now to FIG. 9, a dielectric layer 46 is deposited over the surface of the substrate and over the dummy gates 40 to a thickness of between about 800 and 1000 Angstroms. The dielectric layer 46 may comprise tetraethoxysilane (TEOS) oxide or a composite layer of plasma-enhanced chemically vapor deposited (PE-CVD) TEOS (150 Angstroms) and low temperature (less than or equal to 700° C.) silicon nitride (850 Angstroms). The dielectric layer 46 is anisotropically etched back using a plasma etch to form spacers 48 on the sidewalls of the dummy gates 40, as shown in FIG. 10. Thermal budget control is essential from FIG. 9 onwards by limiting all temperatures to below 700° C.

Figure 11:
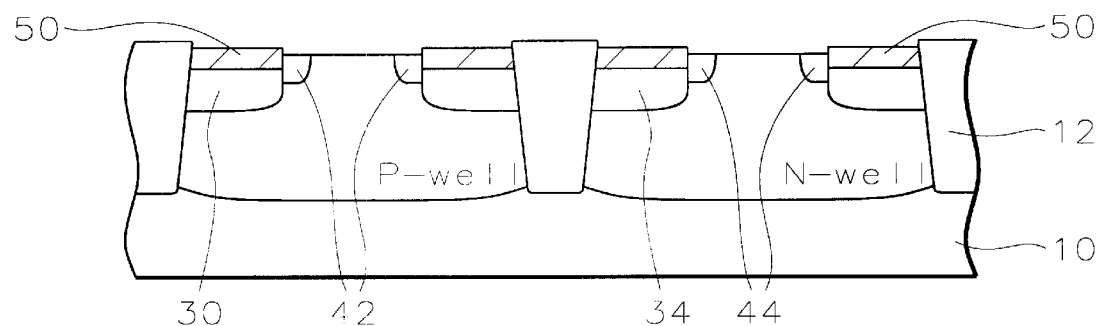

Referring now to FIG. 11, a metal stack is deposited over the substrate. The metal stack may be cobalt with a titanium cap or nickel with a titanium cap. The metal stack is annealed whereby it reacts with the underlying silicon in the source/drain regions to form a metal silicide 50. The unreacted metal stack over the dummy gates is removed. This is a self-aligned silicide (salicide) process. For the nickel silicide process, the thermal budget is measured and the temperature is kept below 600° C. The NiSi process is preferred to minimize abnormal source-drain lateral dopant diffusion which would result in worse short channel effects.

Referring now to FIG. 11, the dummy nitride gates 40 are removed by hot $H_3PO_4$, for example. The underlying oxide layer 18 is removed by a dilute hydrofluoric acid (1:100) and a conventional RCA clean. This cleaning step is time-linked (four hours) to the subsequent high-k dielectric deposition.

Figure 12:
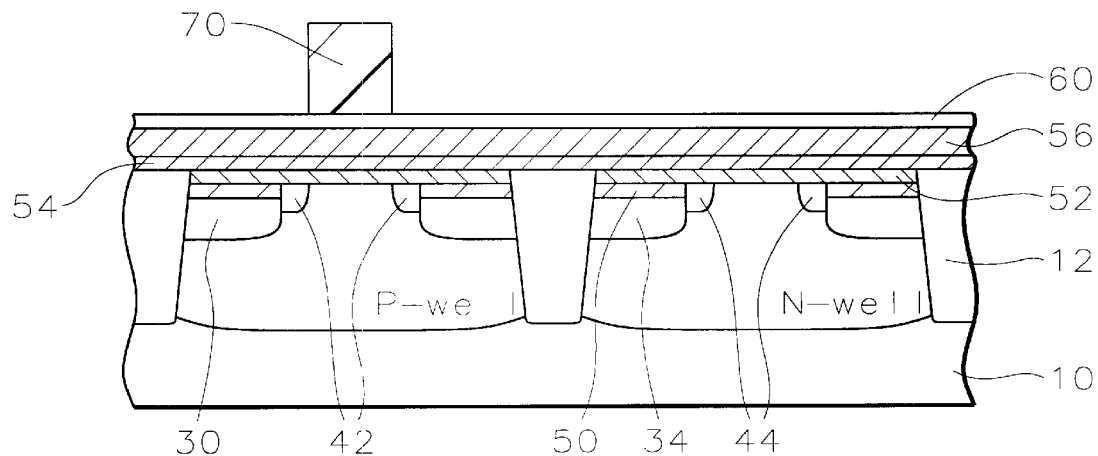

Now the dual-metal gates of the present invention are to be fabricated. First, as shown in FIG. 12, a high dielectric constant (k) material layer 52 is deposited by an atomic layer CVD process over the exposed silicon substrate and over the salicided source/drain regions, followed by a low temperature anneal. This high-k layer may contain a stack comprising silicon oxynitride or silicon oxide followed by one of silicon nitride, (Ba, $Sr_4$) TiO, $Ta_xO_y$, $TiO_x$, $HfO_2$, $ZrO_2$, and so on. The silicate glass is first deposited; a subsequent low temperature anneal in an oxygen or nitrogen ambient produces an oxide or oxynitride layer between the silicate glass and the silicon substrate. The base layer 52 has a thickness of between about 30 and 35 Angstroms.

Now, a barrier metal layer 54 is deposited over the base dielectric layer 52. The barrier metal layer may comprise tantalum, tantalum nitride, titanium nitride, or tungsten nitride deposited by an atomic layer CVD process to a thickness of between about 50 and 80 Angstroms. Now, a first metal layer 56, comprising molybdenum, titanium nitride, tungsten, titanium, copper, or suicides, is deposited over the barrier metal layer to a thickness of between about 1600 and 1800 Angstroms. Finally, an anti-reflective coating layer (BARC) 60, such as silicon nitride or $SiO_xN_y$ is deposited over the first metal layer to a thickness of between about 300 and 600 Angstroms. Thickness is based on the k-value of the BARC layer and subsequent simulation to minimize refection from the metal layers.

The first metal layer stack is now to be patterned to form the first metal gate. For example, the first gate formed is shown to be the NFET gate. It will be understood by those skilled in the art that alternatively, the PFET gate could be formed first. A photoresist mask 70 is formed over the metal stack. The metal stack 60/56/54 and dielectric layer 52 are etched away where they are not covered by the mask 70 to form the first metal gate 56, illustrated in FIG. 13.

Figure 13:
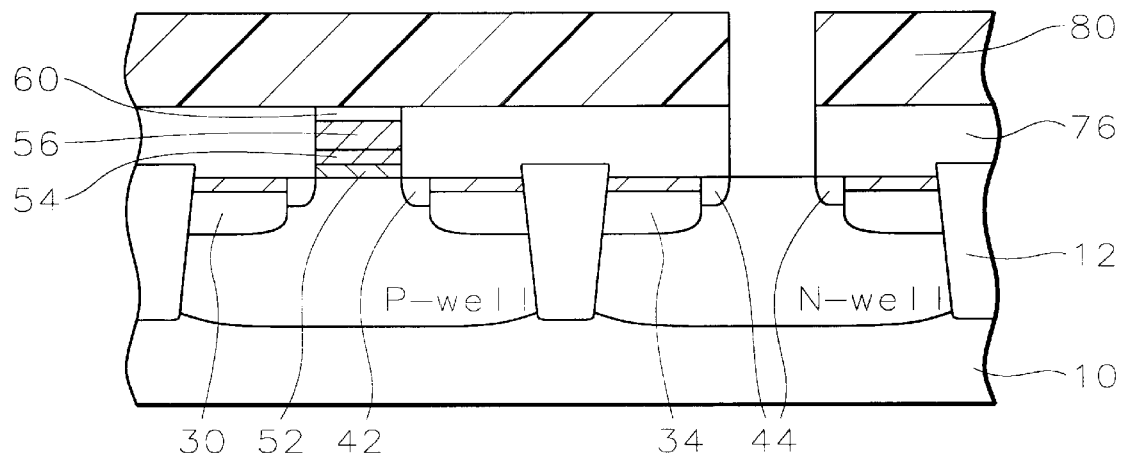

Referring now to FIG. 13, an oxide layer, such as borophospho-tetraethoxys-lane (BPTEOS) 76 or undoped silicate glass (USG) is deposited to a thickness of between about 5000 and 6000 Angstroms over the substrate and the first metal gate. The BPTEOS layer 76 is polished back to the anti-reflective coating layer 60, such as by chemical mechanical polishing (CMP).

Now, another photoresist mask 80 is formed having an opening where a second metal gate is to be formed. The BPTEOS layer 76 is etched through to the substrate where it is not covered by the mask 80. The mask 80 is stripped off by dry ashing and a wet chemical rinse, for example.

Figure 14:
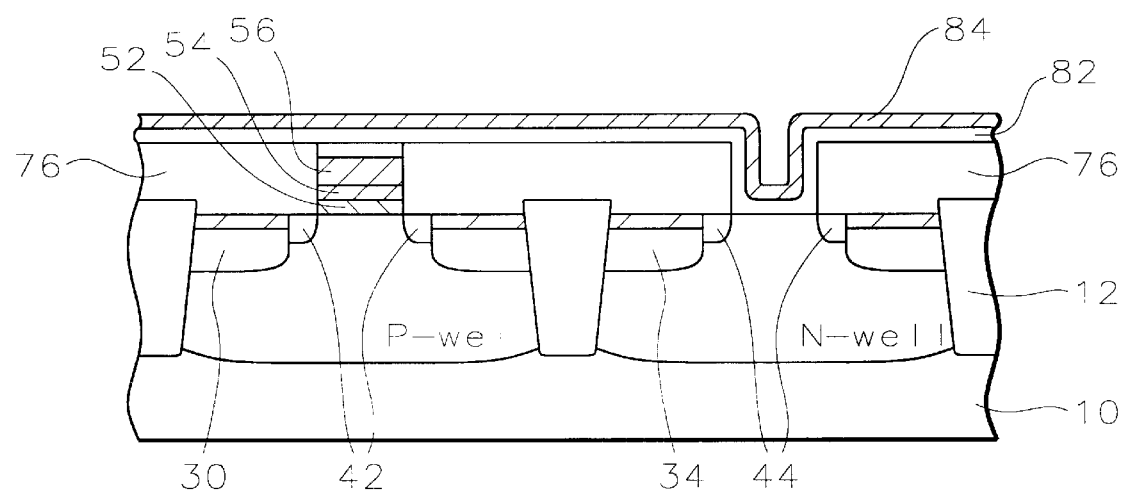

Referring now to FIG. 14, a high-k dielectric layer 82 is deposited within the second gate opening. The high-k material layer 82 may have the same composition and thickness as the first gate dielectric layer 52. Now, a barrier metal layer 84 is deposited over the base dielectric layer 82. The barrier metal layer may comprise titanium nitride or tantalum nitride deposited by an atomic layer CVD process to a thickness of between about 50 and 80 Angstroms.

Figure 15:
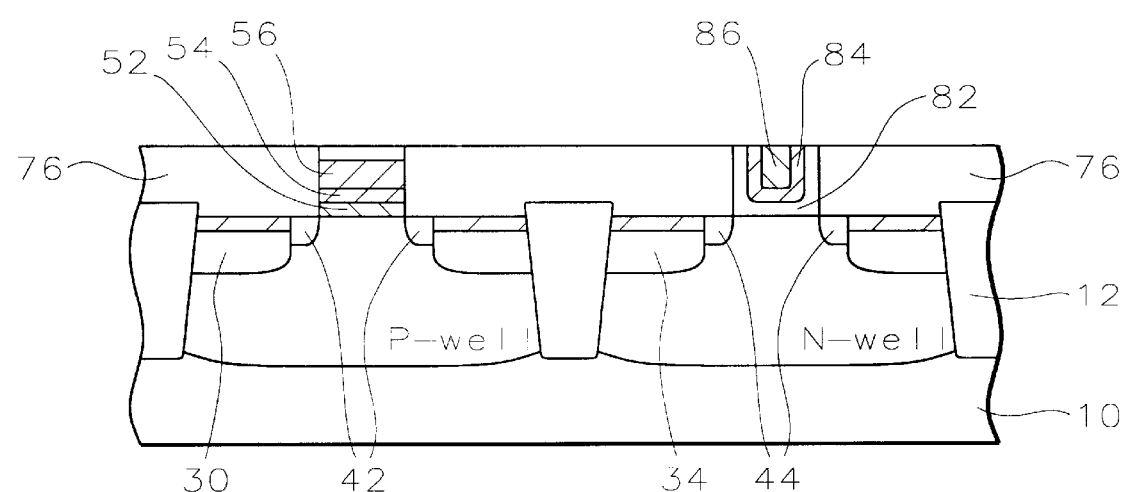

Now, a second metal layer 86, comprising molybdenum, titanium nitride, tungsten, titanium, copper, or silicides, is deposited over the barrier metal layer 84 and polished back such as by CMP to complete the second metal gate 86, as shown in FIG. 15. This completes the formation of dual-metal gates for CMOS transistors. It is important to note that the process of the present invention allows great flexibility in the choice of gate materials. The NMOS and PMOS gates can be made of different metals to fine-tune the gate work function, thereby allowing the fabrication of symmetrical threshold voltages for both NMOS and PMOS.

Figure 16:
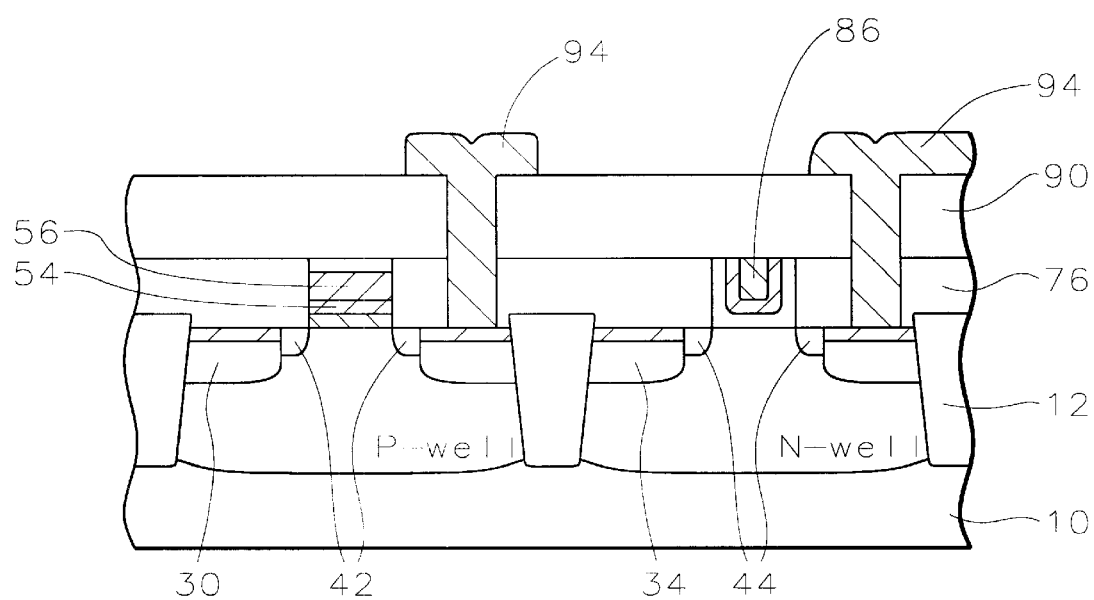
FIG. 16 is a cross-sectional representation of a completed integrated circuit fabricated according to a preferred embodiment of the present invention.

Processing continues to form contacts and back end processing, as is conventional in the art. For example, FIG. 16 illustrates an interlevel dielectric layer 90 covering the metal gates 56 and 86. Openings have been etched through the interlevel dielectric layers, and contacts 94 made, for example, as shown, to the source/drain regions.

The process of the present invention provides a simple, manufacturable dual-metal gate process. The process scheme allows a great flexibility in the choice of gate materials. By a simple isotropic etch technique, the LDD and source/drain implantation steps can be reversed. This is important to the formation of a well-controlled shallow junction.

While the invention has been particularly shown and described with reference to the preferred embodiments thereof, it will be understood by those skilled in the art that various changes in form and details may be made without departing from the spirit and scope of the invention.

What is claimed is:

1. A method of forming dual-metal gate CMOS transistors in the fabrication of integrated circuits comprising:

providing an NMOS active area and a PMOS active area of a semiconductor substrate separated by isolation regions;

forming a pad oxide layer overlying said semiconductor substrate in each of said active areas;

depositing a nitride layer overlying said pad oxide layer;

patterning said nitride layer to form a first dummy gate in each of said active areas;

implanting ions to form source/drain regions in each of said active areas not covered by said first dummy gates;

isotropically etching said first dummy gates to form second dummy gates thinner than said first dummy gates;

implanting ions to form lightly doped source/drain regions in each of said active areas not covered by said second dummy gates;

forming dielectric spacers on sidewalls of said second dummy gates;

thereafter siliciding said source/drain regions;

thereafter removing said second dummy gates and said spacers;

depositing a first gate dielectric layer overlying said substrate and said silicided source/drain regions;

depositing a first diffusion barrier layer overlying said first gate dielectric layer;

depositing a first metal layer overlying said first diffusion barrier layer;

patterning said first metal layer, said first diffusion barrier layer, and said first gate dielectric layer to form a first metal gate in one of said NMOS and PMOS active areas;

depositing an oxide layer overlying said substrate and said first metal gate and polishing back said oxide layer to said first metal gate;

opening a via through said oxide layer to said substrate in the other one of said NMOS and PMOS areas;

depositing a second gate dielectric layer within said via;

depositing a second diffusion barrier layer overlying said second gate dielectric layer;

depositing a second metal layer overlying said second diffusion barrier layer and polishing back said second metal layer to said oxide layer to form a second metal gate on said other one of said NMOS and PMOS areas to complete formation of said dual-metal gate CMOS transistors in the fabrication of an integrated circuit.

2. The method according to claim 1 further comprising forming a P-well in said NMOS active area and forming an N-well in said PMOS active area.

3. The method according to claim 1 wherein said pad oxide layer comprises silicon dioxide and has a thickness of between about 100 and 150 Angstroms.

4. The method according to claim 1 wherein said nitride layer has a thickness of between about 2400 and 2600 Angstroms.

5. The method according to claim 1 wherein said source/drain regions are activated by a rapid thermal annealing after said source/drain regions are implanted and wherein said lightly doped source/drain regions are activated by a laser annealing after said lightly doped source/drain regions are implanted.

6. The method according to claim 1 wherein said source/drain regions and said lightly doped source/drain regions are activated by a single rapid thermal annealing after said lightly doped source/drain regions are implanted.

7. The method according to claim 1 wherein said step of siliciding said source/drain regions comprises siliciding a cobalt/titanium-cap layer or a nickel/titanium-cap layer.

8. The method according to claim 1 wherein said oxide layer comprises borophospho-tetraethoxysilane (BPTEOS) oxide or undoped silicate glass having a thickness of between about 5000 and 6000 Angstroms.

9. The method according to claim 1 wherein said step of removing said second dummy gates comprises using hot $H_3PO_4$.

10. The method according to claim 1 wherein said first and second gate dielectric layers comprise a high-k silicon oxide layer having a thickness of between about 30 and 35 Angstroms.

11. The method according to claim 1 wherein said first diffusion barrier layer comprises tantalum, tantalum nitride, titanium nitride, or tungsten nitride and has a thickness of between about 50 and 80 Angstroms.

12. The method according to claim 1 further comprising depositing a anti-reflective coating layer overlying said first metal layer wherein said anti-reflective coating layer comprises silicon oxynitride or silicon nitride and has a thickness of between about 300 and 600 Angstroms.

13. The method according to claim 1 wherein said first and second metal layers may comprise different materials and wherein said materials are molybdenum, titanium nitride, tungsten, copper, titanium, or silicides.

14. A method of forming dual-metal gate CMOS transistors in the fabrication of integrated circuits comprising:

providing an NMOS active area and a PMOS active area of a semiconductor substrate separated by isolation regions;

forming a pad oxide layer overlying said semiconductor substrate in each of said active areas;

depositing a nitride layer overlying said pad oxide layer;

patterning said nitride layer to form a first dummy gate in each of said active areas;

implanting first ions to form source/drain regions in each of said active areas not covered by said first dummy gates;

isotropically etching said first dummy gates to form second dummy gates thinner than said first dummy gates;

implanting second ions to form lightly doped source/drain regions in each of said active areas not covered by said second dummy gates;

thereafter driving in said first and second ions in a single rapid thermal annealing step;

forming dielectric spacers on sidewalls of said second dummy gates;

thereafter siliciding said source/drain regions;

thereafter removing said second dummy gates and said spacers;

depositing a first gate dielectric layer overlying said substrate and said silicided source/drain regions;

depositing a first diffusion barrier layer overlying said first gate dielectric layer;

depositing a first metal layer overlying said first diffusion barrier layer;

patterning said first metal layer, said first diffusion barrier layer, and said first gate dielectric layer to form a first metal gate in one of said NMOS and PMOS active areas;

depositing an oxide layer overlying said substrate and said first metal gate and polishing back said oxide layer to said first metal gate;

opening a via through said oxide layer to said substrate in the other one of said NMOS and PMOS areas;

depositing a second gate dielectric layer within said via; depositing a second diffusion barrier layer overlying said second gate dielectric layer;

depositing a second metal layer overlying said second diffusion barrier layer and polishing back said second metal layer to said oxide layer to form a second metal gate on said other one of said NMOS and PMOS areas to complete formation of said dual-metal gate CMOS transistors in the fabrication of an integrated circuit.

15. The method according to claim 14 further comprising forming a P-well in said NMOS active area and forming an N-well in said PMOS active area.

16. The method according to claim 14 wherein said pad oxide layer comprises silicon dioxide and has a thickness of between about 100 and 150 Angstroms.

17. The method according to claim 14 wherein said nitride layer has a thickness of between about 2400 and 2600 Angstroms.

18. The method according to claim 14 wherein said step of siliciding said source/drain regions comprises siliciding a cobalt/titanium-cap layer or a nickel/titanium-cap layer.

19. The method according to claim 14 wherein said oxide layer comprises borophospho-tetraethoxysilane (BPTEOS) oxide or undoped silicate glass having a thickness of between about 5000 and 6000 Angstroms.

20. The method according to claim 14 wherein said step of removing said second dummy gates comprises using hot $H_3PO_4$.

21. The method according to claim 14 wherein said first and second gate dielectric layers comprise a high-k silicon oxide layer having a thickness of between about 30 and 35 Angstroms.

22. The method according to claim 14 wherein said first and second diffusion barrier layers comprise tantalum, tantalum nitride, titanium nitride or tungsten nitride and have a thickness of between about 50 and 80 Angstroms.

23. The method according to claim 14 wherein said first and second metal layers may comprise different materials and wherein said materials are molybdenum, titanium nitride, tungsten, copper, titanium, or silicides.

24. A method of forming dual-metal gate CMOS transistors in the fabrication of integrated circuits comprising:

providing an NMOS active area and a PMOS active area of a semiconductor substrate separated by isolation regions;

forming a pad oxide layer overlying said semiconductor substrate in each of said active areas;

depositing a nitride layer overlying said pad oxide layer;

patterning said nitride layer to form a first dummy gate in each of said active areas;

implanting first ions to form source/drain regions in each of said active areas not covered by said first dummy gates and driving in said first ions using rapid thermal annealing;

isotropically etching said first dummy gates to form second dummy gates thinner than said first dummy gates;

implanting second ions to form lightly doped source/drain regions in each of said active areas not covered by said second dummy gates and driving in said second ions using a laser annealing;

forming dielectric spacers on sidewalls of said second dummy gates;

thereafter siliciding said source/drain regions;

thereafter removing said second dummy gates and said spacers;

depositing a first gate dielectric layer overlying said substrate and said silicided source/drain regions;

depositing a first diffusion barrier layer overlying said first gate dielectric layer;

depositing a first metal layer overlying said first diffusion barrier layer;

patterning said first metal layer, said first diffusion barrier layer, and said first gate dielectric layer to form a first metal gate in one of said NMOS and PMOS active areas;

depositing an oxide layer overlying said substrate and said first metal gate and polishing back said oxide layer to said first metal gate;

opening a via through said oxide layer to said substrate in the other one of said NMOS and PMOS areas;

depositing a second gate dielectric layer within said via; depositing a second diffusion barrier layer overlying said second gate dielectric layer;

depositing a second metal layer overlying said second diffusion barrier layer and polishing back said second metal layer to said oxide layer to form a second metal gate on said other one of said NMOS and PMOS areas to complete formation of said dual-metal gate CMOS transistors in the fabrication of an integrated circuit.

25. The method according to claim 24 further comprising forming a P-well in said NMOS active area and forming an N-well in said PMOS active area.

26. The method according to claim 24 wherein said nitride layer has a thickness of between about 2400 and 2600 Angstroms.

27. The method according to claim 24 wherein said step of siliciding said source/drain regions comprises siliciding a cobalt/titanium-cap layer or a nickel/titanium-cap layer.

28. The method according to claim 24 wherein said oxide layer comprises borophospho-tetraethoxysilane (BPTEOS) oxide or undoped silicate glass having a thickness of between about 5000 and 6000 Angstroms.

29. The method according to claim 24 wherein said step of removing said second dummy gates comprises using hot $H_3PO_4$.

30. The method according to claim 24 wherein said first and second gate dielectric layers comprise a high-k silicon oxide layer having a thickness of between about 30 and 35 Angstroms.

31. The method according to claim 24 wherein said first and second diffusion barrier layers comprise tantalum, tantalum nitride, titanium nitride, or tungsten nitride and have a thickness of between about 50 and 80 Angstroms.

32. The method according to claim 24 wherein said first and second metal layers may comprise different materials and wherein said materials are molybdenum, titanium nitride, tungsten, copper, titanium, or silicides.

* * * * *